(12) United States Patent
Jung

(10) Patent No.: US 7,326,525 B2
(45) Date of Patent: *Feb. 5, 2008

(54) TOP ANTI-REFLECTIVE COATING POLYMER, ITS PREPARATION METHOD AND TOP ANTI-REFLECTIVE COATING COMPOSITION COMPRISING THE SAME

(75) Inventor: Jae-chang Jung, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/081,151

(22) Filed: Mar. 16, 2005

(65) Prior Publication Data

US 2006/0008732 A1    Jan. 12, 2006

(30) Foreign Application Priority Data

Jul. 6, 2004    (KR) ............... 10-2004-0052263

(51) Int. Cl.
G03F 7/30 (2006.01)
C03F 22/20 (2006.01)
G03F 7/20 (2006.01)
G03F 7/11 (2006.01)

(52) U.S. Cl. ............... 430/326; 430/273.1; 526/318.42

(58) Field of Classification Search ............... None
See application file for complete search history.

(56) References Cited

U.S. PATENT DOCUMENTS

| | | | |
|---|---|---|---|
| 4,681,833 A * | 7/1987 | Nagasawa et al. | 430/175 |
| 5,879,853 A | 3/1999 | Azuma | |
| 5,972,557 A * | 10/1999 | Sasaki et al. | 430/215 |
| 6,057,080 A | 5/2000 | Brunsvold et al. | |
| 6,274,295 B1 | 8/2001 | Dammel et al. | |
| 6,451,498 B1 * | 9/2002 | Pirri et al. | 430/270.1 |
| 2001/0003030 A1 * | 6/2001 | Jung et al | 430/273.1 |
| 2003/0219682 A1 | 11/2003 | Wakiya et al. | |
| 2004/0224525 A1 * | 11/2004 | Endo et al. | 438/745 |
| 2005/0007570 A1 * | 1/2005 | Streefkerk et al. | 355/30 |
| 2005/0036184 A1 * | 2/2005 | Yeo et al. | 359/15 |
| 2005/0123863 A1 * | 6/2005 | Chang et al. | 430/322 |
| 2005/0147920 A1 * | 7/2005 | Lin et al. | 430/311 |
| 2005/0202351 A1 * | 9/2005 | Houlihan et al. | 430/322 |

FOREIGN PATENT DOCUMENTS

| | | | |
|---|---|---|---|
| EP | 1426822 A1 * | 6/2004 | |
| GB | 2320501 A * | 6/1998 | |
| GB | 2357509 A * | 6/2001 | |
| KR | 1998-0050128 | 9/1998 | |
| KR | 1998-080195 | 11/1998 | |
| KR | 2001-0011766 | 2/2001 | |
| KR | 2001-0057924 | 7/2001 | |
| KR | 0355604 | 10/2002 | |
| KR | 2004-0037282 | 5/2004 | |

OTHER PUBLICATIONS

Smith et al., "Water immersion optical lithography at 193 nm", J. microlithl, Microfab., Microsyst. vol. 3, No. 1, Jan. 2004, pp. 44-51.*
English Translation of KR 10-0355604 published Jul. 5, 2001, translated by FLS, Inc for The United Stated Patent and Trademark Office, Washington, D.C. Jul. 2007 and Numbered PTO 07-5754, 23 pages and cover sheet.*
English Translation of KR 19980080195 published Nov. 25, 1998, translated by Schreiber Translations Inc for The United States Patent and Trademark Office, Washington, D.C. Jul. 2007 and Numbered PTO 07-5758, 20 pages and cover sheet.*
English Translation of KR 01011766 published Feb. 15, 2001, translated by Schreiber Translations Inc for The United States Patent and Trademark Office, Washington, D.C. Aug. 2007 and Numbered PTO 07-5775, 58 pages and cover sheet.*

* cited by examiner

Primary Examiner—Cynthia Hamilton
(74) Attorney, Agent, or Firm—Marshall, Gerstein & Borun LLP

(57) ABSTRACT

Disclosed herein are top anti-reflective coating polymers used in a photolithography process, methods for preparing the anti-reflective coating polymer, and anti-reflective coating compositions comprising the disclosed anti-reflective coating polymers. The top anti-reflective coating polymers are used in immersion lithography for the fabrication of a sub-50 nm semiconductor device. The top anti-reflective coating polymer is represented by Formula 1 below:

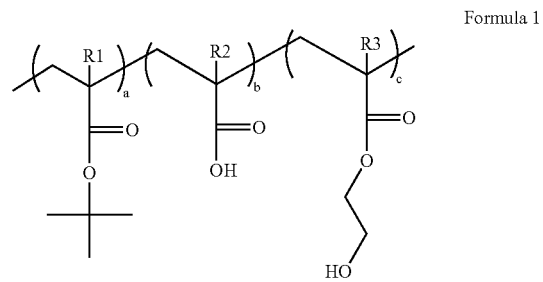

Formula 1 wherein R1, R2 and R3 are independently hydrogen or a methyl group; and a, b and c represent the mole fraction of each monomer, and are independently in the range between about 0.05 and about 0.9. Because the disclosed top anti-reflective coatings are not soluble in water, they can be used in immersion lithography using water as a medium for the light source. In addition, since the top anti-reflective coatings can reduce the reflectance from an underlayer, the uniformity of CD is improved, thus enabling the formation of ultrafine patterns.

17 Claims, 1 Drawing Sheet

TOP ANTI-REFLECTIVE COATING POLYMER, ITS PREPARATION METHOD AND TOP ANTI-REFLECTIVE COATING COMPOSITION COMPRISING THE SAME

BACKGROUND

1. Technical Field

Anti-reflective coating polymers used in a photolithography process, which is one of the fabrication processes for a semiconductor device are disclosed. A method for preparing the anti-reflective coating polymer, and an anti-reflective coating composition comprising the anti-reflective coating polymer are also disclosed. The disclosed anti-reflective coating polymers can be used in immersion lithography for the fabrication of sub-50 nm semiconductor devices.

2. Description of the Related Art

A photolithography process is a process for the transfer of a semiconductor circuit pattern formed on a photomask to a wafer. Photolithography is one of the most important steps in determining the fineness or side and integration density of circuits in the fabrication of semiconductor devices.

In recent years, as the integration density of semiconductor devices has increased, new techniques have been developed that are adapted to fine processing required in the fabrication of semiconductor devices. Under these circumstances, there is an increasing need for an ultrafine photolithography process technique. That is, as the circuit linewidths become finer and finer, the use of short-wavelength light sources for illumination, such as KrF, ArF, $F_2$ and EUV excimer lasers, and high numerical aperture lenses is required. EUV, $F_2$, ArF and KrF lasers in this order are preferentially used as light sources because of their short wavelength.

A number of studies on the development of sub-50 nm devices have been actively undertaken. In response to these studies, recent attention has been directed toward the development of suitable processing equipment and materials associated with the use of $F_2$ and EUV as exposure light sources. Technical solutions for the use of $F_2$ are satisfactory to some extent, but there are the following problems: 1) the mass production of high-quality $CaF_2$ within a short time is limited, 2) since soft pellicles are likely to be deformed upon exposure to light at 157 nm, the storage stability is decreased, and 3) hard pellicles incur considerable production cost, and are difficult to produce on a commercial scale due to their nature of light refraction.

On the other hand, since suitable light sources, exposure equipment and masks are required to use an EUV laser, it is not yet suitable for practical use. Accordingly, the formation of finer high-precision photoresist patterns by using a photoresist adapted to the use of an ArF excimer laser has now become a key technical task. Under these circumstances, immersion lithography has recently drawn significant attention.

Dry lithography is a currently used lithography process, and is an exposure system wherein air is filled between an exposure lens and a wafer. In contrast to dry lithography, immersion lithography, which corresponds to a NA (numerical aperture) scaling technique, is an exposure system wherein water is filled between an exposure lens and a wafer. Since water (refractive index (n)=1.4) is used as a medium for a light source in the immersion lithography, the NA is 1.4 times larger than that in the dry lithography using air (refractive index (n)=1.0). Accordingly, immersion lithography is advantageous in terms of a higher resolution.

A problem encountered with the fabrication of a sub-50 nm semiconductor device is that an alteration in the critical dimension (CD) of a photoresist pattern inevitably takes place, during the process for the formation of an ultrafine pattern, by standing waves, reflective notching, and diffracted and reflected light from an underlayer due to the optical properties of the, underlayer on an overlying photoresist and due variations in the thickness of the photoresist. To prevent reflected light from the underlayer, a light-absorbing material, called an "anti-reflective coating," at a wavelength band of light used as an exposure light source is introduced between the underlayer and the photoresist. A bottom anti-reflective coating interposed between the underlayer and the photoresist has been used. With the recent increase in the fineness of overlying photoresist patterns, a top anti-reflective coating (TARC) has also been used to prevent the photoresist pattern from being disrupted by the reflected and diffracted light. Specifically, as the remarkable miniaturization of semiconductor devices makes overlying photoresist patterns extremely fine, the use of a bottom anti-reflective coating alone cannot completely prevent the patterns from being disrupted by scattered reflection. Accordingly, a top anti-reflective coating is used to prevent the disruption of the patterns.

However, since conventional top anti-reflective coatings for use in dry lithography are water-soluble (in the case of using KrF or ArF laser), they cannot be applied to immersion lithography. In other words, since water is used as a medium for a light source in immersion lithography, the conventional top anti-reflective coatings are easily dissolved in the water.

Accordingly, an ideal top anti-reflective coating for use in immersion lithography must satisfy the following requirements:

first, the top anti-reflective coating must be transparent to a light source;

second, the top anti-reflective coating must have a refractive index between 1.4 and 2.0, depending on the kind of an underlying photosensitive film (i.e. photoresist) to be used;

third, when the top anti-reflective coating composition is coated on an underlying photosensitive film, it must not dissolve the photosensitive film; f fourth, the top anti-reflective coating must not be soluble in water upon light exposure; and finally, the top anti-reflective coating must be soluble in a developing solution upon development.

The above-mentioned stringent requirements make the development of a suitable top anti-reflective coating for use in immersion lithography extremely difficult and challenging.

Thus, there exists a strong need for the development of a top anti-reflective. coating for use in immersion lithography which is water-insoluble and can minimize the alteration of CD.

SUMMARY OF THE DISCLOSURE

In view of the above problems, a top anti-reflective coating polymer is disclosed which can be used in immersion lithography due to its water insolubility, which can prevent the multiple interference of light inside a photoresist in the formation of a photoresist pattern, and which can inhibit the alteration in the dimensions of the photoresist pattern resulting from the variation in the thickness of the photoresist.

A method for preparing the top anti-reflective coating polymer is also disclosed.

A top anti-reflective coating composition comprising the top anti-reflective coating polymer is also disclosed.

A method for forming a pattern by using the top anti-reflective coating composition is also disclosed.

In order to accomplish the above objects of the present invention, there is provided a top anti-reflective coating polymer having a weight-average molecular weight in a range of from about 1,000 to about 1,000,000, represented by Formula 1 below:

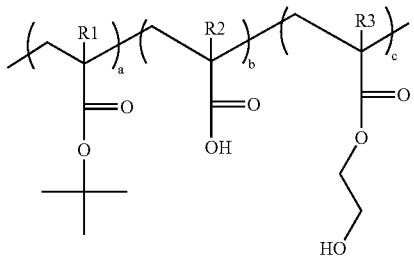

Formula 1 wherein R1, R2 and R3 are independently hydrogen or a methyl group; and a, b and c represent the mole fraction of each monomer, and are in the range of between about 0.05 and about 0.9.

The disclosed top anti-reflective coating polymers exhibit high light transmission, and thus are suitable for use as a top anti-reflective coating. In addition, since the top anti-reflective coating polymers are highly soluble in a developing solution after light exposure, they have no effect on the formation of a pattern. Furthermore, since the top anti-reflective coating polymers are water-insoluble, they can be applied to immersion lithography. Moreover, since the top anti-reflective coating polymers can prevent scattered reflection from the top of a photoresist, they can effectively prevent a photoresist pattern from being disrupted by the scattered reflection.

Considering the physical properties, including solubility and reflective index, of an anti-reflective coating to be coated on top of the photoresist, the disclosed top anti-reflective coating polymers have a weight-average molecular weight in the range of from about 1,000 to about 1,000,000, and preferably in the range from about 2,000 to about 10,000. Too high of a molecular weight causes a decrease in the solubility in a developing solution. As a result, a portion of the anti-reflective coating remains on the photoresist after development, causing contamination of the pattern. On the other hand, too low a molecular weight cannot ensure optimized reflective index of the anti-reflective coating and good overcoating on the photoresist.

The poly(t-butylacrylate-acrylic acid-2-hydroxyethylmethacrylate) copolymer represented by Formula 1 can be prepared by dissolving a t-butylacrylate monomer, an acrylic acid monomer and a 2-hydroxyethylmethacrylate monomer in an organic solvent, adding a polymerization initiator to the solution, and subjecting the mixture to free-radical polymerization at a temperature range of 55° C.~65° C. for a time period in the range of 6~12 hours.

Any organic solvent that can be used in free-radical copolymerization can be used in the method of the present invention. Preferably, the organic solvent is selected from the group consisting of propyleneglycolmethylether acetate (PGMEA), tetrahydrofuran, cyclohexanone, dimethylformamide, dimethylsulfoxide, dioxane, methyl ethyl ketone, ethylacetate, benzene, toluene, xylene, and mixtures thereof. PGMEA is more preferred.

Further, the polymerization initiator is preferably selected from the group consisting of 2,2'-azobisisobutyronitrile (AIBN), benzoylperoxide, acetylperoxide, laurylperoxide, t-butylperacetate, t-butylhydroperoxide and di-t-butylperoxide. The use of 2,2'-azobisisobutyronitrile (AIBN) is more preferred.

In another aspect, a top anti-reflective coating composition comprising an effective amount of a top anti-reflective coating polymer with a weight-average molecular weight of from about 1,000 to about 1,000,000, represented by Formula 1 below:

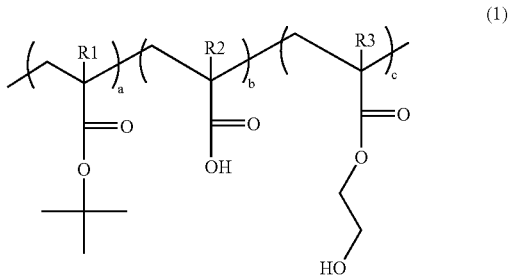

(1)

wherein R1, R2 and R3 are independently hydrogen or a methyl group; and a, b and c individually represent the mole fraction of each monomer, and are individually in the range between about 0.05 and about 0.9.

The disclosed top anti-reflective coating compositions are prepared by dissolving the top anti-reflective coating polymer in n-butanol. The top anti-reflective coating composition thus prepared has an optimal reflective index in the range of from about 1.4 to about 2.0. Accordingly, when the top anti-reflective coating composition is overcoated on top of a photoresist, the reflectance can be minimized and thus the photoresist pattern can be protected from being disrupted by reflected light.

Considering the reflective index and thickness of the anti-reflective coating composition, the n-butanol is preferably added in an amount in the range of from about 1,000 to about 10,000 wt %, based on the weight of the polymer of Formula 1. If the amount of the n-butanol is outside this range, the reflective index of the anti-reflective coating falls outside the range of between about 1.4 and about 2.0 and the thickness of the anti-reflective coating cannot be optimized.

If desired, the top anti-reflective coating composition may further comprise from about 1 to about 20 wt % of L-proline, based on the weight of the polymer of Formula 1. The L-proline acts to further inhibit the diffusion of an acid toward the unexposed region.

In another aspect, a method for forming a pattern of a semiconductor device comprises: (a) applying a photoresist to a semiconductor substrate on which a particular structure has been previously formed; (b) applying the top anti-reflective coating composition on top of the photoresist, and baking to form a top anti-reflective coating; and (c) exposing the photoresist to light, and developing the exposed photoresist to form a photoresist pattern.

The pattern formation method is characterized in that the anti-reflective coating formed on top of the photoresist is formed of the top anti-reflective coating composition of the present invention. Since the top anti-reflective coating thus prepared has a reflective index in the range of from about 1.4 to about 2.0, the reflectance at the top of the photoresist can be minimized. Accordingly, the photoresist pattern formed by the disclosed method has greatly improved pattern uniformity.

The baking is preferably carried out at a temperature range from about 70° C. to about 200° C.

The disclosed anti-reflective coating composition and the pattern formation method are primarily applicable to a process for forming an ultrafine pattern using an ArF light source (193 nm). Likewise, they can be applied to a process for forming an ultrafine pattern using a light source (e.g., F2 or EUV) having a shorter wavelength, so long as water can be used as a medium for the light source. The exposure using the light source is preferably achieved with an exposure energy in the range of from about 0.1 to about 50 mJ/cm$^2$.

In the disclosed pattern formation method, the developing can be carried out by using an alkaline developing solution. As a particularly preferred alkaline developing solution, from about a 0.01 to about a 5% (w/w) solution of tetramethylammoniumhydroxide (TMAH) is used.

In still another aspect, the disclosed top anti-reflective coating composition is used in the fabrication of a semiconductor device. Since the disclosed top anti-reflective coating composition can minimize scattered reflection, it can be applied to various processes for fabricating semiconductor devices, in addition to the formation process of an ultrafine pattern.

It will be appreciated that the disclosed top anti-reflective coating compositions can be applied to a variety of processes in ways obvious to those skilled in the art, depending on the type of the processes. Accordingly, the detailed explanations concerning the application of the disclosed anti-reflective coating compositions to the fabrication of semiconductor devices are omitted.

BRIEF DESCRIPTION OF THE DRAWINGS

The above and other features and other advantages of the disclosed compositions and methods will be more clearly understood from the following detailed description taken in conjunction with the accompanying drawing, wherein.

DETAILED DESCRIPTION OF THE PRESENTLY PREFERRED EMBODIMENTS

Figure 1:
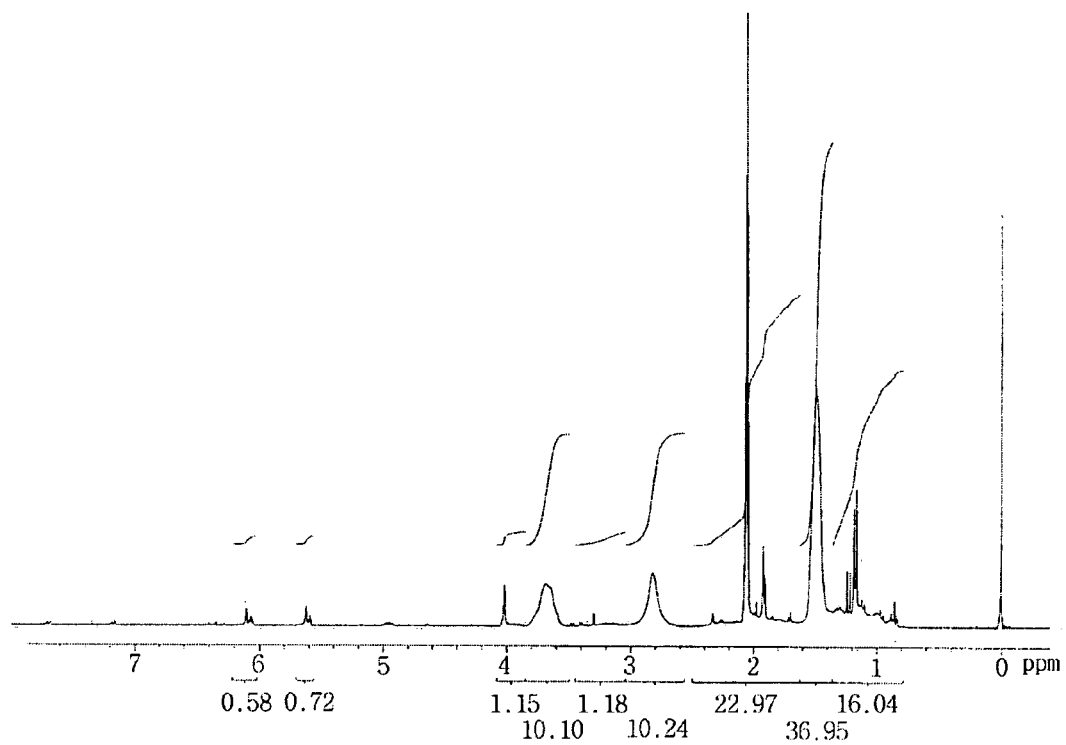
FIG. 1 is a $^1$H-NMR spectrum of a disclosed top anti-reflective coating polymer prepared in Example 1.

The examples are given for the purpose of illustration and are not to be construed as limiting the scope of this disclosure.

EXAMPLE 1

Preparation of Top Anti-Reflective Coating Polymer 12 g of t-butylacrylate, 5 g of acrylic acid, 3 g of 2-hydroxyethylmethacrylate and 0.4 g of AIBN were added to 200 g of PGMEA, and were then polymerized at 60° C. for 8 hours. After completion of the polymerization, the mixture was precipitated in ether, filtered, and dried in vacuo to yield 16 g of t-butylacrylate-acrylic acid-2-hydroxyethylmethacrylate copolymer, as a white solid, represented by Formula 2 below:

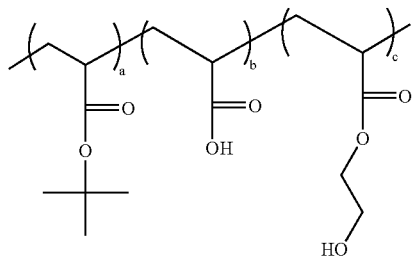

Formula 2 wherein a, b and c represent the mole fraction of each monomer, and are in the range between 0.05 and 0.9.

The structure of the copolymer was identified through 1H-NMR spectrum (FIG. 1).

EXAMPLE 2

Preparation of Top Anti-Reflective Coating Composition 2.5 g of the polymer prepared in Example 1, and 0.04 g of L-proline, which is an amino acid, were dissolved in 100 g of n-butanol to give a top anti-reflective coating composition for use in immersion lithography.

EXAMPLE 3

Formation of Anti-Reflective Coating

The top anti-reflective coating composition prepared in Example 2 was coated on a wafer at 2,000 rpm to form an anti-reflective coating. The thickness, light transmission (at 193 nm), and reflective index of the anti-reflective coating were shown to have 47 nm, 93%, and 1.60, respectively.

EXAMPLE 4

Formation of Top Anti-Reflective Coating

The top anti-reflective coating composition prepared in Example 2 was coated on a photosensitive film (AR1221J, JSR) having a thickness of 220 nm at 2,000 rpm to form a top anti-reflective coating having a thickness of 267 nm. It was confirmed that the top anti-reflective coating composition of the present invention does not dissolve the photosensitizer.

EXAMPLE 5

Water Solubility Test

The wafer on which the photoresist and the top anti-reflective coating were formed was immersed in liquid, distilled water for about 5 minutes, and dried. The resulting structure was measured to have a thickness of 267.4 nm, which is larger by about 0.4 nm than that before the immersion in water. This result reveals that the disclosed top anti-reflective coating composition was substantially neither dissolved nor swollen in water.

EXAMPLE 6

Solubility Test in Developing Solution

The wafer on which the photoresist and the top anti-reflective coating were formed was developed with a 2.38 (w/w) TMAH developing solution for about one minute, and washed with distilled water. The resulting structure was measured to have a thickness of 220 nm. This indicates that the disclosed top anti-reflective coating composition was completely dissolved by the developing solution.

As apparent from the above description, a top anti-reflective coating formed using the disclosed anti-reflective coating polymers satisfies the following requirements for use in immersion lithography:

first, since the top anti-reflective coating has a light transmission of 93% or higher, it is transparent to a light source;

second, the top anti-reflective coating has a refractive index between 1.4 and 2.0;

third, the top anti-reflective coating composition does not dissolve the photosensitive film;

fourth, the top anti-reflective coating is not soluble in water upon light exposure; and finally, the top anti-reflective coating is highly soluble in a developing solution upon development.

Therefore, the disclosed top anti-reflective coatings can be used in immersion lithography, and can reduce the reflectance at the top of the photoresist, thus minimizing the alteration of CD.

As a result, the disclosed top anti-reflective coatings enable the formation of a fine photoresist pattern, thus contributing to the fabrication of sub-50 nm semiconductor devices.

Although the preferred embodiments have been disclosed for illustrative purposes, those skilled in the art will appreciate that various modifications, additions and substitutions are possible, without departing from the scope and spirit of this disclosure and the accompanying claims.

What is claimed is:

1. A top anti-reflective coating composition comprising a top anti-reflective coating polymer with a weight-average molecular weight in the range of about 1,000 to about 1,000,000, and represented by Formula 1 below:

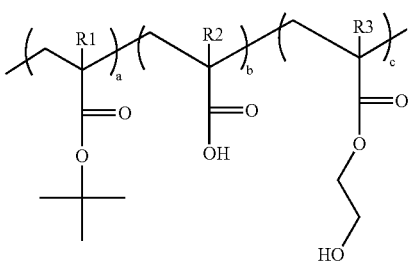

Formula 1 wherein R1, R2, and R3 are independently hydrogen or a methyl group; and a, b, and c each represent the mole fraction of each monomer, and are independently in the range between about 0.05 and about 0.9, said composition being prepared by dissolving the polymer in about 1,000 wt % to about 10,000 wt % of n-butanol, based on the weight of the polymer.

2. The composition according to claim 1, further comprising between about 1 wt % and about 20 wt % of L-proline, based on the weight of the polymer.

3. The composition according to claim 1, wherein the top anti-reflective coating composition has a refractive index between about 1.4 and about 2.0.

4. A method for forming a pattern of a semiconductor device, comprising:
   (a) applying a photoresist to a semiconductor substrate on which a particular structure has been previously formed;
   (b) applying the top anti-reflective coating composition according to claim 1 on top of the photoresist, and baking to form a top anti-reflective coating; and
   (c) exposing the photoresist to light, and developing the exposed photoresist to form a photoresist pattern.

5. The method according to claim 4, wherein the baking is carried out at a temperature ranging from about 70° C. to about 200° C.

6. The method according to claim 5, comprising transmitting light through water in the exposure step.

7. The method according to claim 4, comprising transmitting light through liquid in the exposure step.

8. The method according to claim 4, comprising transmitting light through water in the exposure step.

9. The method according to claim 4, wherein the developing step is carried out by using from about a 0.01 wt % to about a 5 wt % solution of tetramethylammoniumhydroxide (TMAH).

10. A top anti-reflective coating composition comprising an effective amount of a top anti-reflective coating polymer with a weight-average molecular weight in the range of about 1,000 to about 1,000,000, and represented by Formula 1 below:

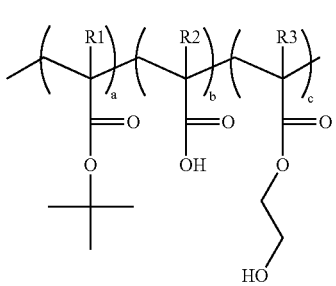

Formula 1 wherein R1, R2 and R3 are independently hydrogen or a methyl group; and a, b and c each represent the mole fraction of each monomer, and are independently in the range between about 0.05 and about 0.9, further comprising between about 1 wt % and about 20 wt % of L-proline, based on the weight of the polymer.

11. The composition according to claim 10, wherein the top anti-reflective coating composition has a refractive index between about 1.4 and about 2.0.

12. A method for forming a pattern of a semiconductor device, comprising:
   (a) applying a photoresist to a semiconductor substrate on which a particular structure has been previously formed;

(b) applying the top anti-reflective coating composition according to claim 10 on top of the photoresist, and baking to form a top anti-reflective coating; and (c) exposing the photoresist to light, and developing the exposed photoresist to form a photoresist pattern.

13. The method according to claim 12, wherein the baking is carried out at a temperature ranging from about 70° C. to about 200° C.

14. The method according to claim 13, comprising transmitting light through water in the exposure step.

15. The method according to claim 12, comprising transmitting light through liquid in the exposure step.

16. The method according to claim 12, comprising transmitting light through water in the exposure step.

17. The method of claim 12, wherein the developing step is carried out by using from about 0.01 wt % to about a 5 wt % solution of tetramethylammoniumhydroxide (TMAH).

* * * * *